United States Patent [19]
Tanaka et al.

[11] Patent Number: 5,155,487
[45] Date of Patent: Oct. 13, 1992

[54] CELL DELINEATION METHOD AND CELL DELINEATION CIRCUIT

[75] Inventors: Katuyoshi Tanaka, Tokyo; Junichirou Yanagi, Kodaira; Akihiko Takase, Tokyo, all of Japan

[73] Assignees: Hitachi, Ltd., Tokyo; Hitachi VLSI Engineering Corporation, Kodaira, both of Japan

[21] Appl. No.: 664,115

[22] Filed: Mar. 4, 1991

[30] Foreign Application Priority Data

Mar. 2, 1990 [JP] Japan .................. 2-049375

[51] Int. Cl.⁵ .............................. H03M 9/00
[52] U.S. Cl. ........................ 341/100; 341/94
[58] Field of Search ............ 341/94, 95, 100

[56] References Cited

U.S. PATENT DOCUMENTS 4,379,286  4/1983  Yokota et al. ............... 341/94
4,447,804  5/1984  Allen ...................... 341/100

OTHER PUBLICATIONS

"Design of Cell Delineation Circuit using Heades Error Control Bits", IEICEJ Technical Report CS-89-70, Nov. 1989.

Primary Examiner—Marc Hoff
Attorney, Agent, or Firm—Antonelli, Terry, Stout & Kraus

[57] ABSTRACT

In a cell delineation circuit, an input signal is converted into parallel signals, and a plurality of parallel signals (i.e. series of parallel signals) which are shifted one bit by one bit from each other are formed from those parallel signals. CRC (Cyclic Redundancy Check) calculations are executed in parallel for the plurality of parallel signals. A series in which a pattern to be calculated satisfies a CRC rule is determined from results of the CRC calculations, and this series is generated, thereby establishing a cell delineation.

18 Claims, 20 Drawing Sheets

CELL DELINEATION METHOD AND CELL DELINEATION CIRCUIT

BACKGROUND OF THE INVENTION

The present invention relates to a cell delineation method and a cell delineation circuit and, more particularly, to a cell delineation method and a cell delineation circuit for establishing a cell delineation by using a point that a certain information block in a cell satisfies a CRC (Cyclic Redundancy Check) rule.

In the case of establishing a cell delineation in a fixed length packet communication, there is a method of establishing the cell delineation by using a point that a certain information block in the cell satisfies the CRC (Cyclic Redundancy Check) rule.

According to the CCITT (International Telegraph and Telephone Consulative Committee), there is shown a method of establishing the cell delineation by using a point that an information block of five bytes from the head of an ATM (Asynchronous Transfer Mode) cell satisfies the CRC rule with respect to the cell delineation of the ATM signal.

A cell delineation circuit using the CRC is characterized in that a CRC calculator is used as a SYNC pattern detector. The CRC calculator is as shown in FIG. 2 in the case where a generator polynomial is expressed by $X^8 + X^2 + X + 1$. According to the CRC calculator, after all of flip-flop circuits 302-1 to 302-8 were reset to 0 at the beginning of calculations, 40 bits are input and, thereafter, the results of the calculations are generated to outputs of the eight flip-flop circuits 302-1 to 302-8 in the case of the ATM cell. In FIG. 2, reference numerals 301-1 to 301-3 denote exclusive-OR.

An example of a construction of the cell delineation circuit in the ATM cell has been described in Toshima and Takino, "Design of Cell Delineation Circuit Using Header Error Control Bits", IEICEJ Technical Report, SC-89-70, November, 1989.

FIGS. 3 and 4 show examples of construction of the cell delineation circuits which have been adapted to the case where a signal speed is high, which examples have been shown in the above-mentioned literature. In FIG. 3, an input signal 101 is converted into parallel signals of eight bits by a serial to parallel converter 1. In order to execute a phase alignment, seven bits among the eight bits are delayed by a delay circuit 2. Thus, resultant parallel signals of fifteen bits are supplied to a shift matrix 201. Parallel output signals of eight bits of the shift matrix 201 are converted into parallel signals of 40 bits by registers 202-1 to 202-4 and are supplied to a CRC calculator 3' for executing calculations, which are feedback loop, in a lump by using logic circuits which are formed to have multiple stages. The results of the CRC calculations are latched and are checked by a zero-detector 4 to see if they satisfy the CRC rule or not. The results of the discriminations are given to a protection circuit 9'. If the CRC rule is continuously satisfied a few times, the cell delineation is established. After the cell delineation has been established, if the CRC rule is subsequently not continuously satisfied a few times, it is determined that a loss of delineation occurred. On the other hand, although all of the patterns were inspected by the phase which is at present being inspected, if the results of the discriminations do not satisfy that CRC rule, a phase alignment is performed by the shift matrix 201 by a signal from a phase alignment controller. By executing the phase alignment, a process is performed by checking whether the CRC coding law is respected for the assumed header field with respect to all of the patterns. A calculation timing generator 5' first starts a CRC coding law checking every eight bits and outputs a control signal for inspection of every cell once an agreement is found.

In FIG. 4, the input signal 101 is converted into the parallel signals of eight bits by the serial to parallel converter 1 and further converted into the parallel signals of 48 bits by registers 205-1 to 205-5. The parallel signals of 48 bits are, moreover, converted into eight series, each of which is a wide parallel signal 40 bits. Each of these series are shifted one bit by one bit from each other. In a manner similar to the case of FIG. 3, the 40-bit parallel signals of the eight series are subjected to calculations of CRC and checks are made to see if they satisfy the CRC rule or not, thereby establishing the cell delineation. However, in the case of FIG. 4, since the CRC calculations are executed in a lump for the signals of eight series having different phases, the phase alignment control as in FIG. 3 is unnecessary and checks of CRC can be performed with respect to all of the patterns. In FIG. 4, reference numerals 3'-1 to 3'-8 denote CRC calculators; 203-1 to 203-8 indicate registers; 4-1 to 4-8 zero-detectors; and 9'-1 to 9'-8 protection circuits.

In the cell delineation circuit of FIG. 3, in order to set the correct phase so as to establish the cell delineation, it is necessary to count the number of pattern mismatch times and align the word phase in accordance with the result of the count value. In the circuit shown in the diagram, in the case where the phase of parallel output signals were aligned, the number of bits to be processed by the CRC is so large to be 40 bits. Therefore, there are problems such that a phase deviation between such bits and the remaining bits in a register occurs, and the result of the calculation of the CRC cannot be used just after completion of the phase alignment. In addition, a delineation acquisition time also increases due to such a phase alignment.

On the other hand, in FIG. 4, the CRC coding law checking result can be obtained bit-by-bit by arranging eight CRC calculators 3'-1 to 3'-8 in parallel. However, there are problems such that as circuits other than the serial to parallel converter, register, shift matrix, and timing generator, it is necessary to use as many circuits as the number of parallel development multiple of the serial to parallel converter. In other words, in the example of FIG. 4, eight CRC calculators, eight zero detectors, etc., are required, thereby greatly increasing the necessary amount of hardware.

SUMMARY OF THE INVENTION

It is a main object of the invention to provide a cell delineation method and a cell delineation circuit which are suitable in the case where a signal speed is high and which can minimize an increase in hardware amount without needing a phase alignment control.

Another object of the invention is to provide a cell delineation circuit having a construction such that the result of the CRC calculation can be output in order to detect/correct a transmission error in a section which is subjected to the CRC calculation.

Still another object of the invention is to provide a cell delineation circuit in which, in the case where the CRC rule was simultaneously satisfied by a plurality of series due to an alignment error, a priority function is given to the selection of the series in which the CRC rule was satisfied so as to prevent the occurrence of competition., A further object of the invention is to provide a cell delineation circuit having a protection circuit to reduce the probabilities of an alignment error and an error in loss of delineation.

Yet object of the invention is to provide a cell delineation circuit having a construction in which a circuit scale is further reduced for an input signal whose byte alignment has been established.

According to a cell delineation circuit of the invention, a plurality of parallel signals which were shifted one bit by one bit relative to each other are formed from parallel signals after completion of the serial to parallel conversion for an input signal, the CRC (Cyclic Redundancy Check) calculations are executed in parallel for the plurality of parallel signals, a series in which a pattern to be subjected to the calculation satisfies the CRC rule is determined from the results of the CRC calculations, and this series is generated, thereby establishing the cell delineation.

According to the cell delineation circuit of the invention, by converting the input signal into the parallel signals, a circuit construction suitable for a high speed signal is formed. On the other hand, since the required number of CRC calculators is determined by the number of parallel CRC calculations which is smaller than that in the conventional technique, the amount of hardware necessary for the CRC calculators can be reduced. Further, the number of registers necessary for the parallel development can also be reduced.

Moreover, according to the invention, since a CRC Coding law checking is executed with respect to each of a plurality of parallel signals which were shifted one bit by bit relative to each other one, for instance, in the case of the parallel signals of eight series which were shifted one bit by one bit, by executing the CRC calculations for every byte of the number which is mutually prime with the number of bytes of the cell, the check of CRC can be executed with respect to the pattern in which all of the bits of the cell are set to the head. Therefore, the check of CRC is performed with respect to all of the phases and, the phase alignment control is unnecessary.

On the other hand, according to the invention, among a plurality of CRC calculators, by outputting the result of the calculation of the CRC calculator of the series in which the cell delineation was established, the transmission error in the section to be subject to the CRC calculation can be detected/corrected.

Further, according to the invention, by giving the function of the priority control to the selection signal generator, even in the case where the CRC rule is unexpectedly satisfied and the zero-detection pulses are detected with respect to a plurality of series, no competition occurs.

According to the invention, by providing the protection circuit the probabilities such that an alignment error and an error in loss of cell delineation occur can be reduced.

According to the invention, further, in the case where the byte alignment is established, by using a circuit construction adapted to such a case, the circuit scale can be further reduced.

DESCRIPTION OF THE PREFERRED EMBODIMENTS

An embodiment of the present invention will be described in detail hereinbelow.

A format of a signal to be processed will be first described prior to explaining the embodiment.

In the ATM transmission, an ATM cell comprises 53 bytes and five bytes from the head are used as a header. A bit train of eight bits to realize an HEC (Header Error Control) function are provided at the fifth byte from the head of the header of the ATM cell. Such a bit train are CRC (Cyclic Redundancy Check) bits which were calculated for the header information section in a range from the head of the header to the fourth byte. The cell delineation is established by using a point that the information blocks of five bytes satisfy the CRC rule.

The embodiment will now be described hereinbelow.

Figure 1:
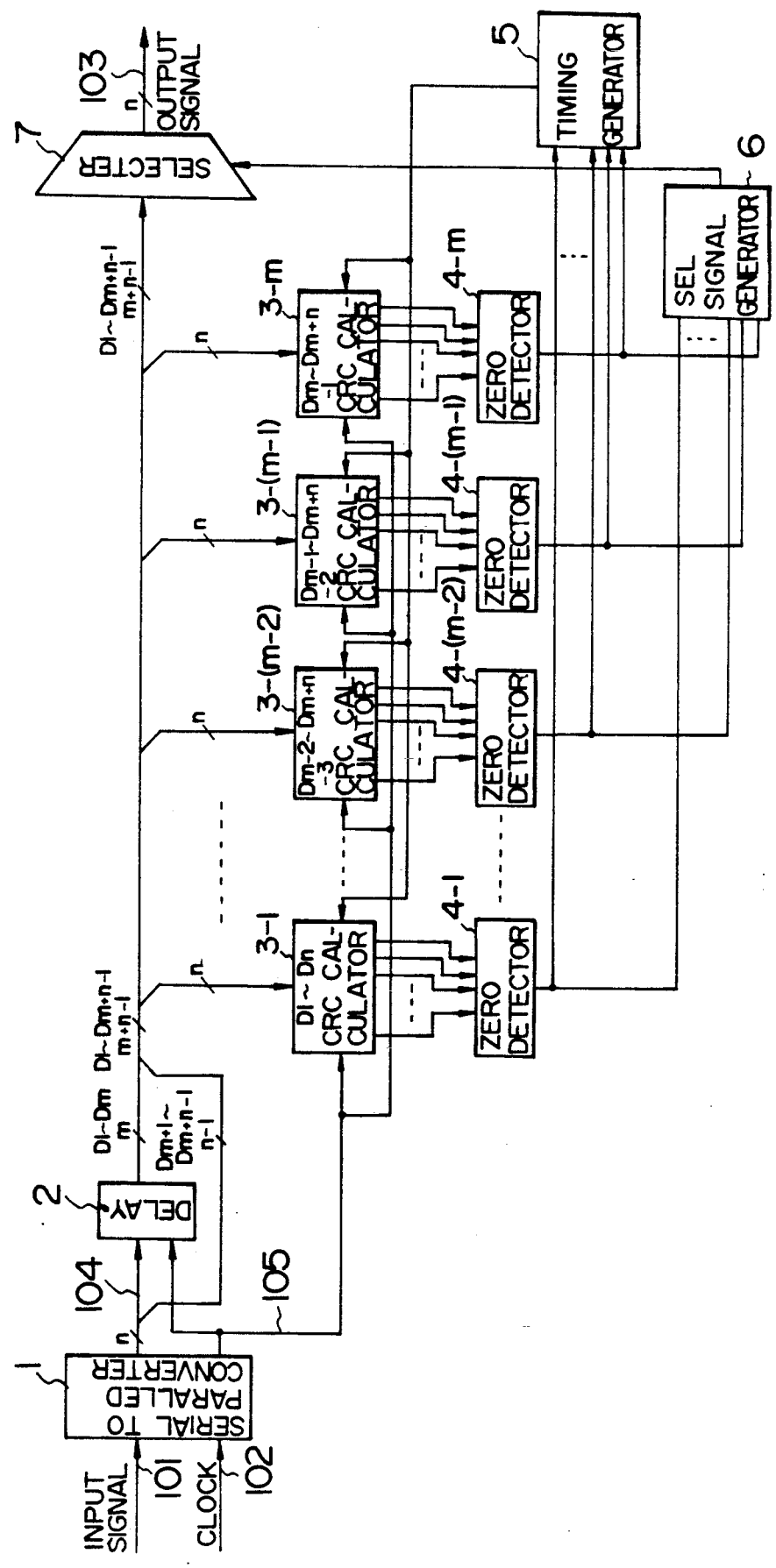
FIG. 1 is a constructional diagram showing a fundamental construction of a cell delineation circuit of the invention.

FIG. 1 is a constructional diagram of an embodiment of the invention. The cell delineation circuit in the embodiment comprises: the serial to parallel converter 1 to form parallel signals of n bits for an input signal; the delay 2 to form the parallel signals of n bits of m series which were shifted one bit by one bit from the above n-bits parallel signals; parallel CRC calculators 3-1 to 3-m, each for executing CRC calculations in an n-bit parallel manner for the n-bits parallel signals of the m series; a timing generator 5 to give calculation timings to the parallel CRC calculators 3-1 to 3-m; zero-detectors 4-1 to 4-m to discriminate whether a pattern to be calculated satisfies the CRC rule or not on the basis of the results of the calculations of the parallel CRC calculators 3-1 to 3-m; an SEL signal generator 6 to output a selection (SEL) signal, to select the series in which the zero-detection was so that performed the cell delineation is established among the n-bits parallel signals of the m series from outputs of the zero-detectors 4-1 to 4-m; and a selector 7 to select and output the series in which the cell delineation is established among the n-bits parallel signals of the m series which were shifted one bit by one bit the SEL signals of the SEL signal generator 6.

Figure 5:
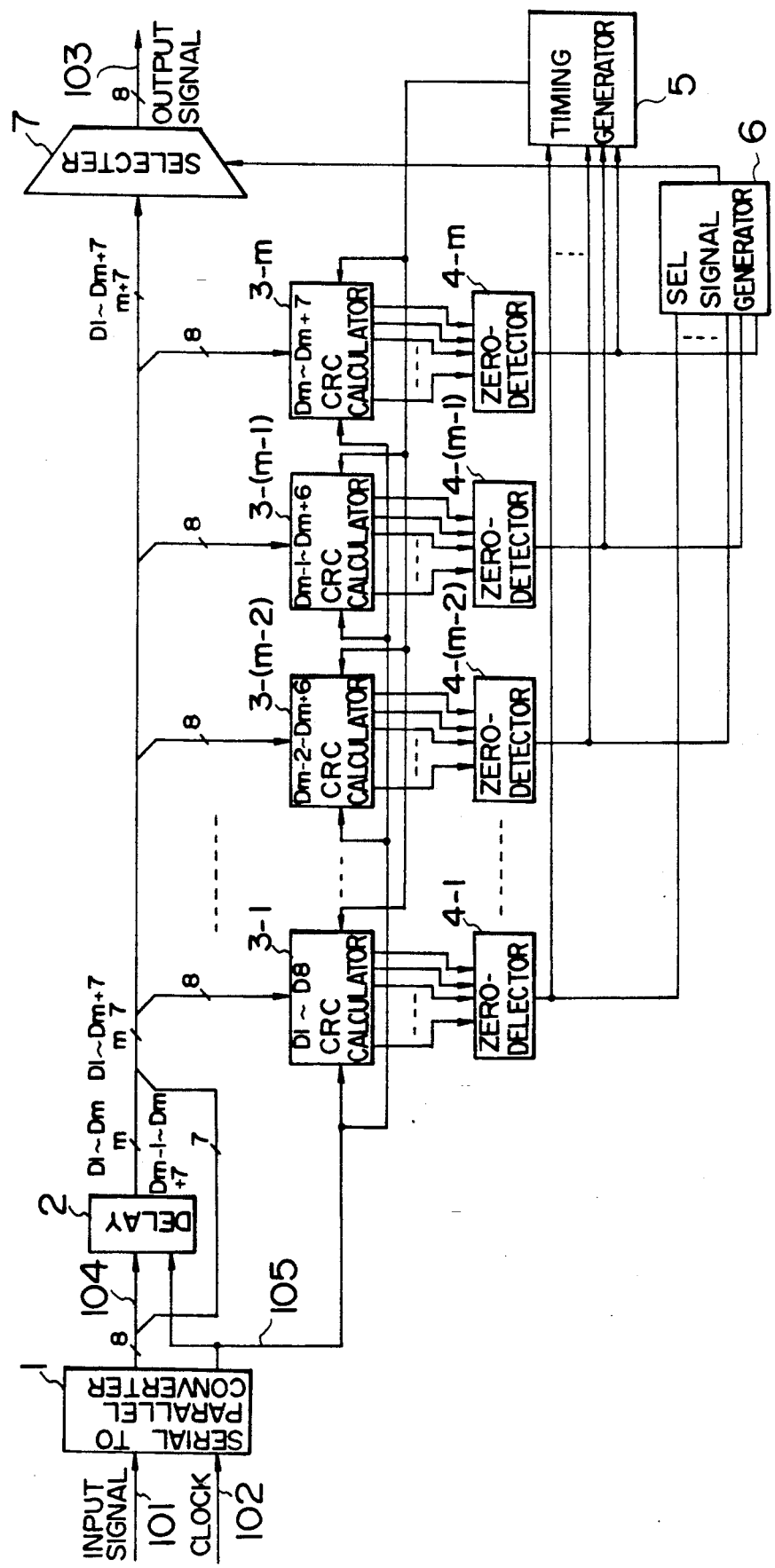
FIG. 5 is a constructional diagram in the case of processing the cell delineation similar to the circuit of FIG. 1 with parallel signals of eight bits width.

FIG. 5 is a constructional diagram of a cell delineation circuit which can execute the byte operation of the circuit of FIG. 1. The circuit of FIG. 5 comprises: the serial to parallel converter 1 to form the parallel signals of eight bits for the input signal; the delay 2 to form the 8-bits parallel signals of m series which were shifted one bit by one from the 8-bits parallel signals output from the converter; the parallel CRC calculators 3-1 to 3-m, each of executing the CRC calculations in an 8-bit parallel manner for the 8-bits parallel signals of the m series; the timing generator 5 to give calculation timings to the parallel CRC calculators 3-1 to 3-m; the zero-detectors 4-1 to 4-m to discriminate whether a pattern to be calculated satisfies the CRC rule or not on the basis of the results of the calculations of the parallel CRC calculators 3-1 to 3-m; the SEL signal generator 6 to output a selection (SEL) signal to select the series in which the zero-detection was obtained and the cell delineation is established among the parallel signals of the m series from the outputs of the zero-detectors 4-1 to 4-m; and the selector 7 to select and output the series in which the cell delineation is established among the 8-bits parallel signals of the m series which were shifted one bit by one bit from the SEL signal of the SEL signal generator 6.

Figure 6:
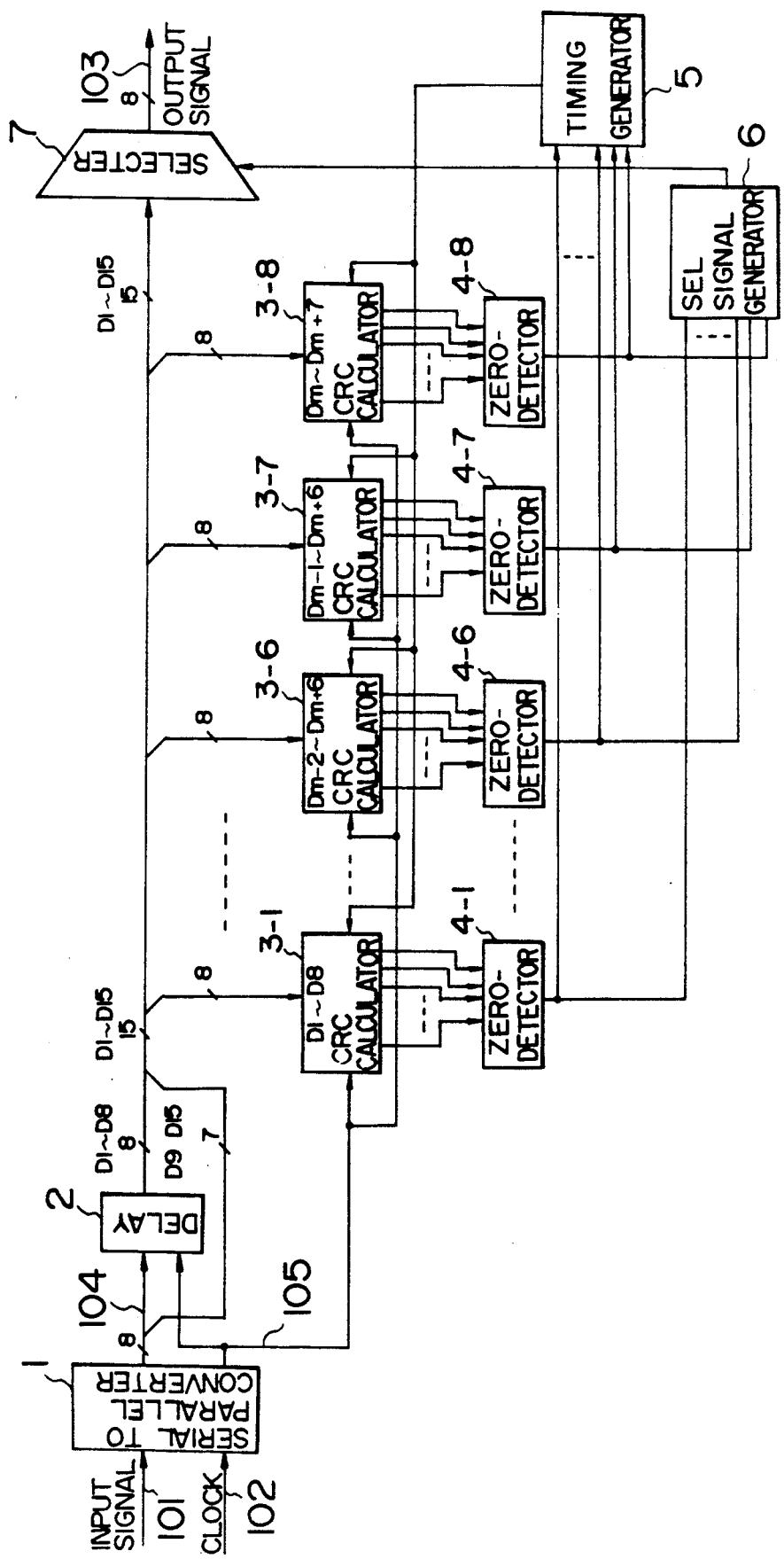
FIG. 6 is a constructional diagram in the case of processing the cell delineation similar to the circuit of FIG. 5 with parallel signals eight series of eight bits parallel signals.

Further, FIG. 6 is a constructional diagram of a cell delineation circuit in which the zero-detection can be performed by a byte operation in the circuit of FIG. 5. The circuit of FIG. 6 comprises: the serial to parallel converter 1 to form the 8-bits parallel signals for the input signal; the delay 2 to form the 8-bits parallel signals of eight series which were shifted one bit by one bit from the 8-bit parallel signals; the parallel CRC calculators 3-1 to 3-8 each for executing the CRC calculations in an 8-bit parallel manner for the 8-bits parallel signals of the eight series; the timing generator 5 to give calculation timings to the parallel CRC calculators 3-1 to 3-8; the zero-detectors 4-1 to 4-8 to discriminate whether a pattern to be calculated satisfies the CRC rule or not on the basis of the results of the calculations of the parallel CRC calculators 3-1 to 3-8; the SEL signal generator 6 to output a selection (SEL) signal to select the series in which the ero-detection was obtained and the cell delineation is established among the 8-bits parallel signals of the eight series from the outputs of the zero-detectors 4-1 to 4-8; and the selector 7 to select and output the series in which the cell delineation is established among the 8-bits parallel signals of the eight series which were shifted one bit by one from the SEL signal of the SEL signal generator 6.

The operation will now be described with reference to FIG. 6.

Figure 2:
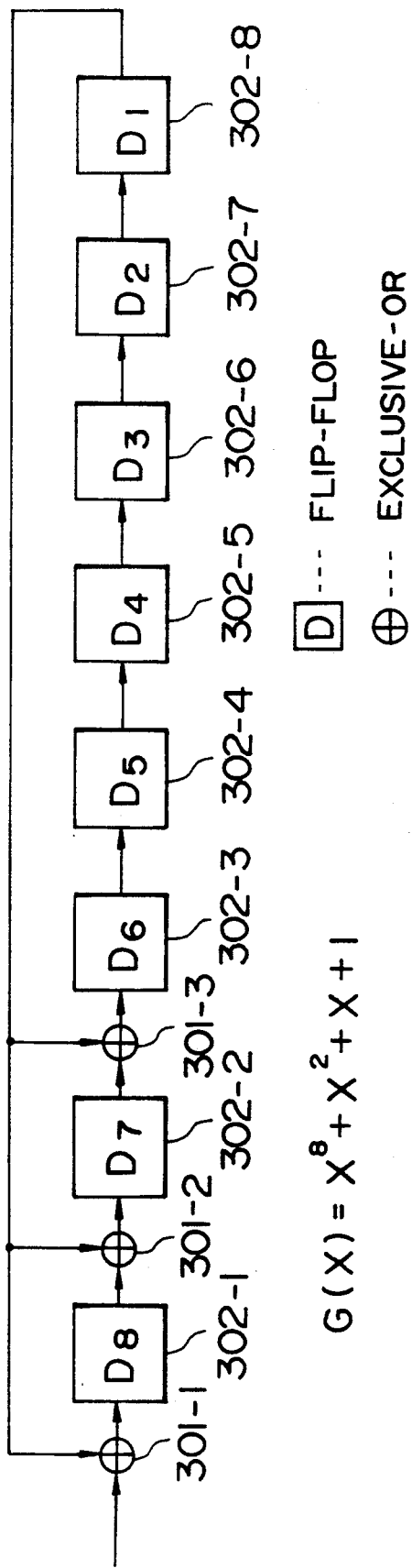
FIG. 2 is a circuit diagram of a CRC calculator in the case where a generator polynomial is expressed by $X^8 + X^2 + X + 1$.
Figure 3:
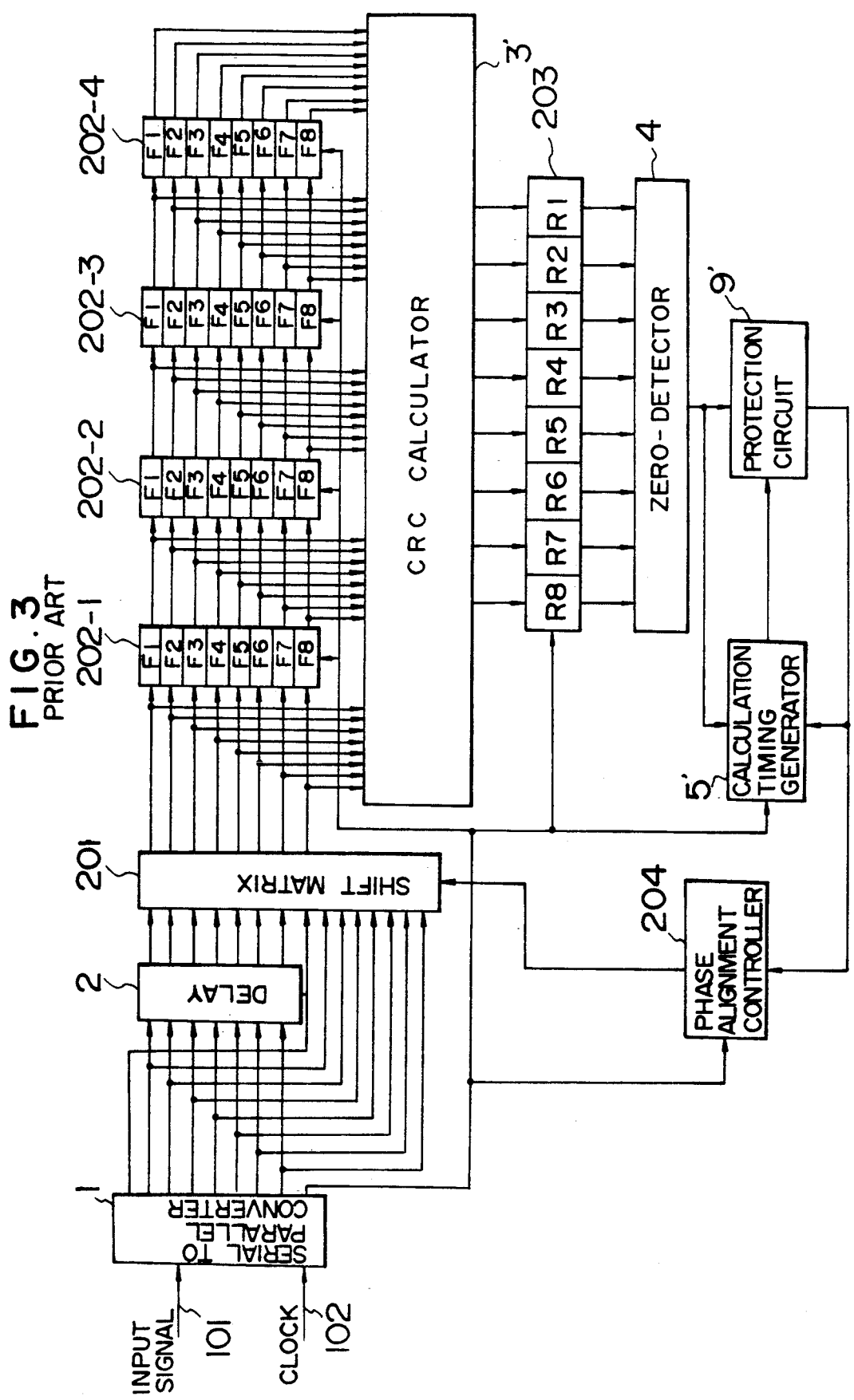
FIG. 3 is a constructional diagram of the first well-known example of a cell delineation circuit.
Figure 4:
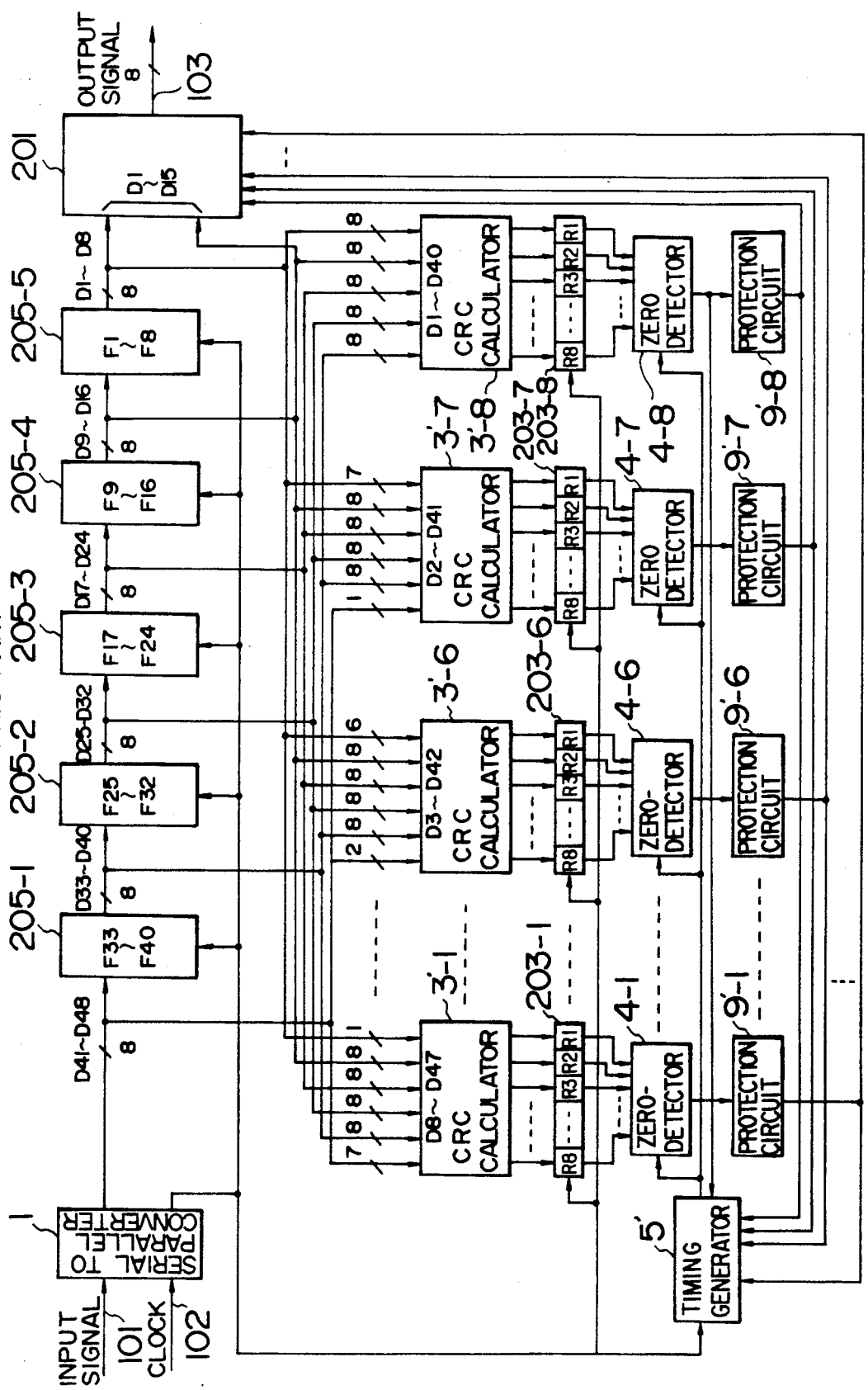
FIG. 4 is a constructional diagram of the second well-known example of the cell delineation circuit.
Figure 7:
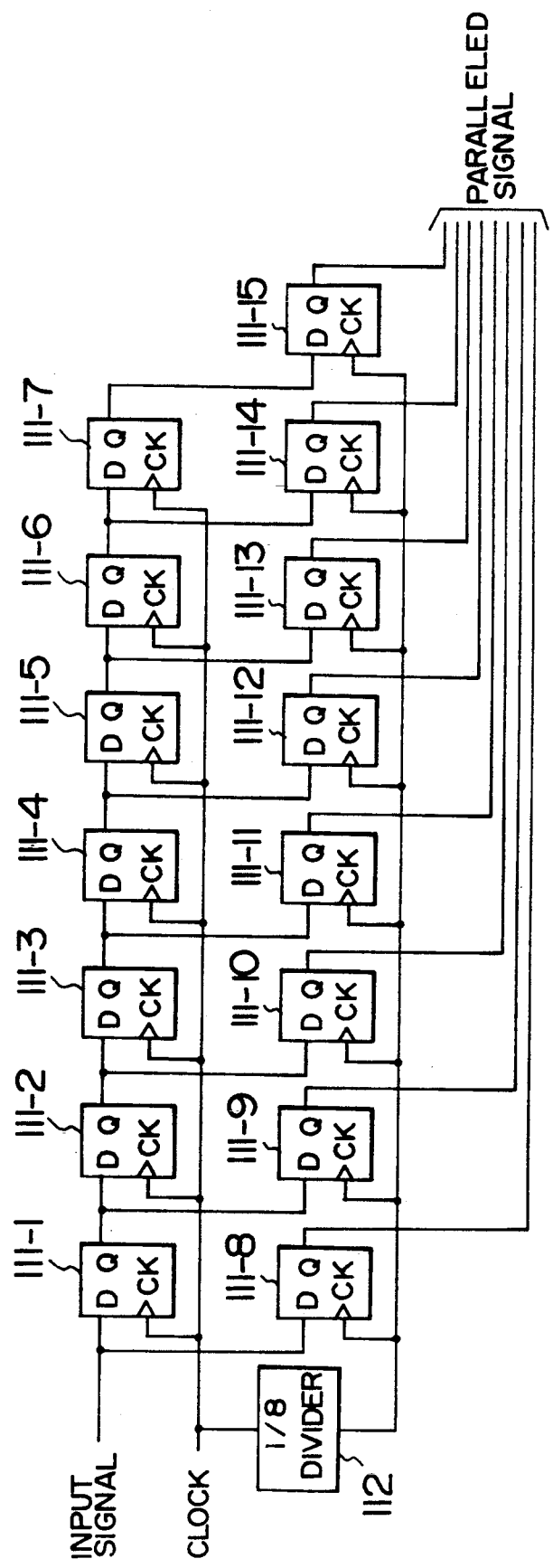
FIG. 7 is a circuit constructional diagram of a serial to parallel converter.
Figure 8:
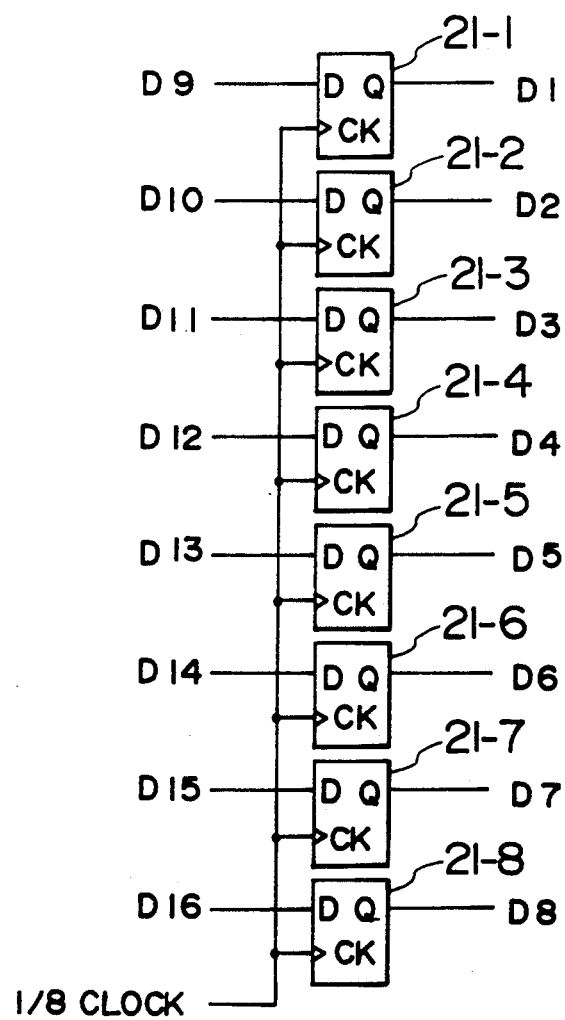
FIG. 8 is a circuit constructional diagram of a delay.
Figure 9:
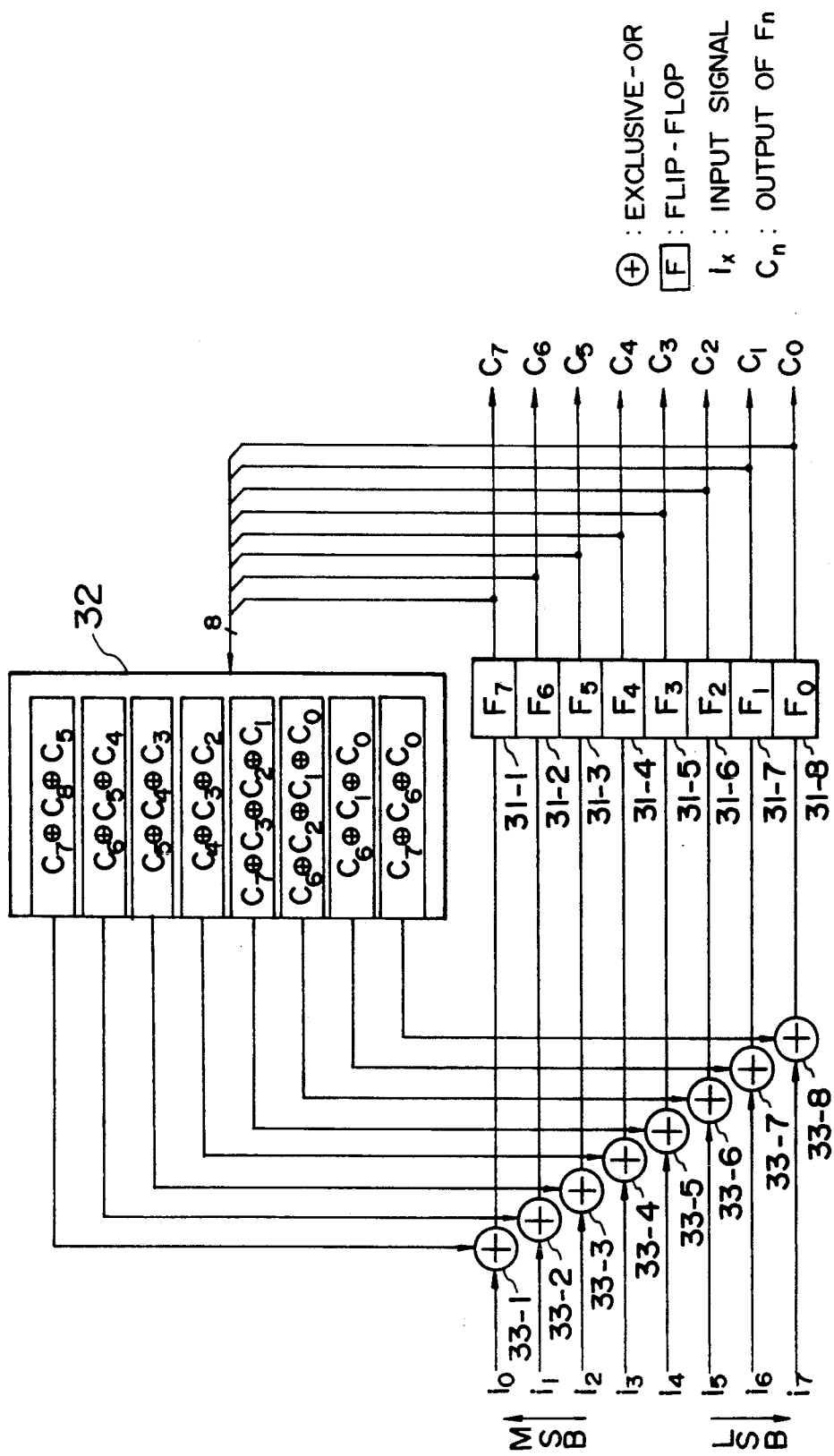
FIG. 9 is a circuit constructional diagram of a CRC calculator of the 8-bit parallel type.
Figure 10:
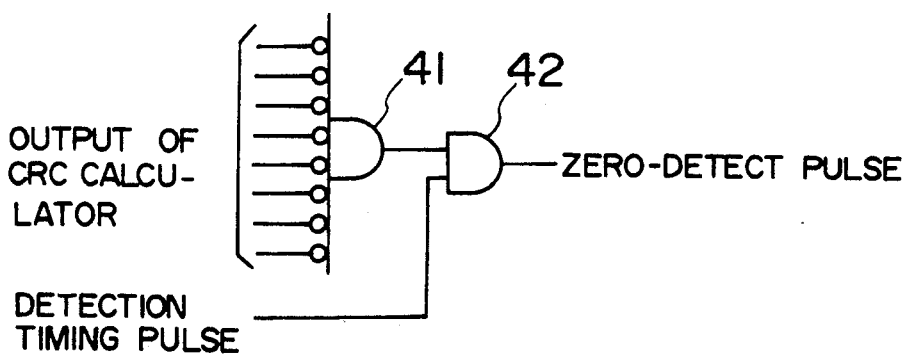
FIG. 10 is a circuit constructional diagram of a zero-detector.
Figure 11:
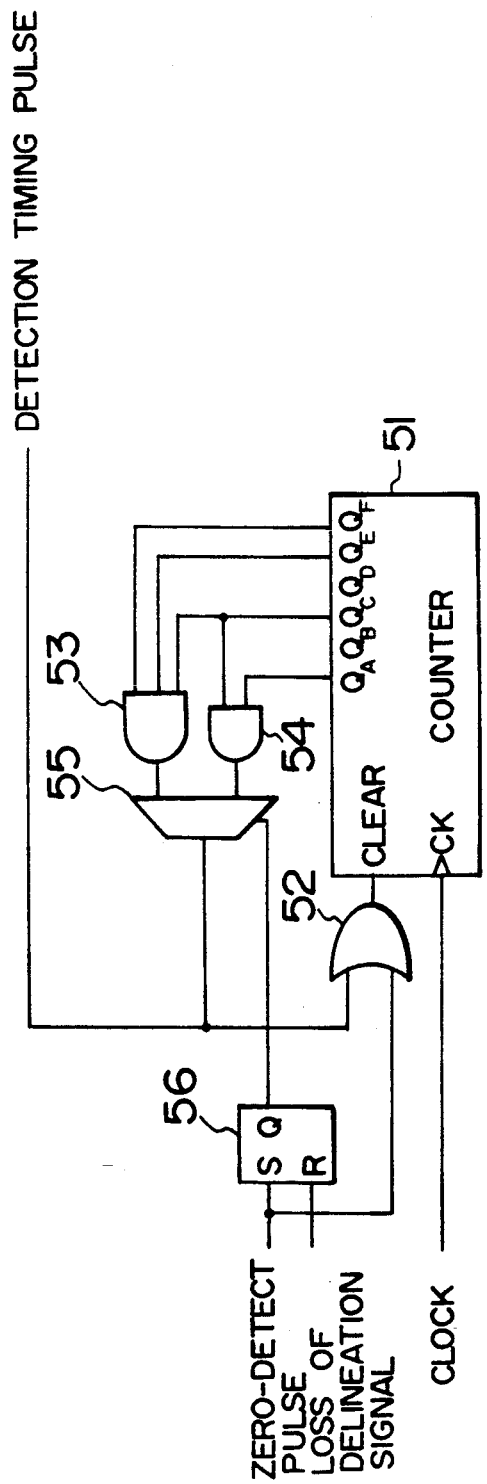
FIG. 11 is a circuit constructional diagram of a timing generator.
Figure 12:
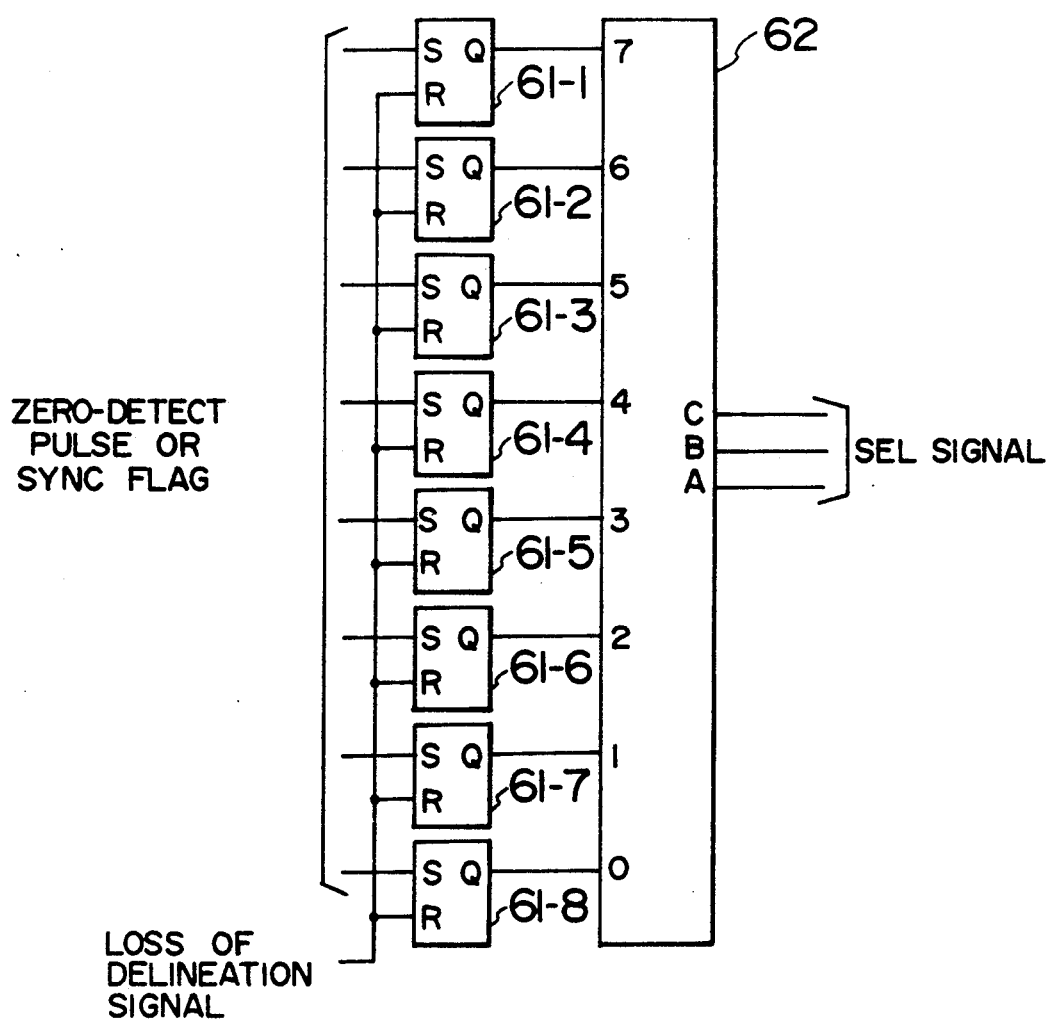
FIG. 12 is a circuit constructional diagram of an SEL signal generator.
Figure 13:
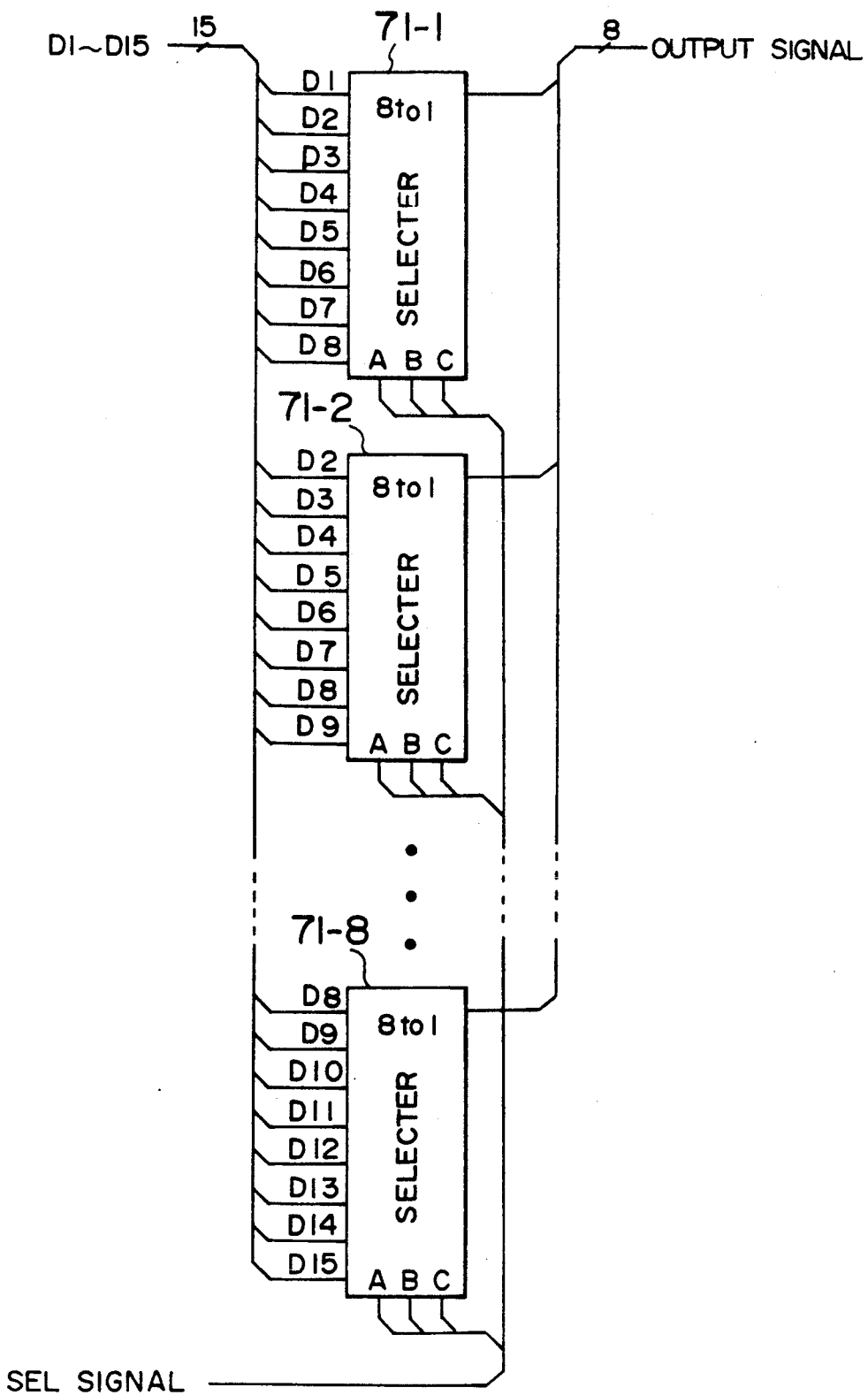
FIG. 13 is a circuit constructional diagram of a selector.

In the operation of the embodiment of FIG. 6, the input signal is first converted into the parallel signals of eight bits so that the input signal can be byte-operated. To convert the input signal into the parallel signals of eight bits, the serial to parallel converter shown in FIG. 7 can be used. The 8-bits parallel signals are delayed by one clock by the delay shown in FIG. 8 and are merged to the upper seven bits which are not delayed, so that the parallel signals of 15 bits are derived. The 8-bits parallel signals of eight series which were shifted one bit by one are formed from eight bits at the head from the 15-bits parallel signals. The 8-bits parallel signals are supplied to the parallel CRC calculators 3-1 to 3-8 of eight bits, respectively. The circuits shown in FIG. 9 can be used as the 8-bit parallel CRC calculators 3-1 to 3-8. FIG. 9 shows a circuit in which the CRC calculator in the case where the generator polynomial shown in FIG. 2 is expressed by $X^8 + X^2 + X + 1$ was constructed by parallel CRC calculators of eight bits. The parallel CRC calculators reset all of flip-flops 31-1 to 31-8 to 0 at the beginning of the calculations. In the case of using an ATM cell as an object to be calculated, since five bytes are used for a calculation, five clocks are needed for the calculation. On the other hand, since one clock is necessary to reset the circuits to 0, six clocks (as many as six bytes) are necessary until the next calculation is executed after one calculation was started. The ATM cell comprises 53 bytes. By executing the CRC calculations every bytes of the number which is mutually prime with the number of bytes of the ATM cell, the CRC calculations can be performed with respect to the pattern in which all of the bits of the ATM cell are set to the head. Therefore, by calculating every six bytes, checks of CRC can be executed with respect to all of the phases. The results of the calculations of the 8-bits parallel CRC calculators 3-1 to 3-8 are supplied to the zero-detectors 4-1 to 4-8. The zero-detectors 4-1 to 4-8 discriminate whether the CRC rule is satisfied or not. Circuits shown in FIG. 10 can be used as the zero-detectors 4-1 to 4-8. If the CRC rule is satisfied, 0 is generated as results of the calculations of the CRC calculators 3-1 to 3-8. Therefore, the zero-detectors 4-1 to 4-8 detect the timings when the results of the calculations of the CRC calculators 3-1 to 3-8 are set to 0. Since the CRC calculators 3-1 to 3-8 also output the signals during the calculating operations, the zero-detectors 4-1 to 4-8 detect only the results of the CRC calculations by detection timing pulses. The detection timing pulses are generated from a timing generator shown in FIG. 11. Until the zero-detection is obtained by the zero-detectors 4-1 to 4-8, the timing generator in FIG. 11 generates the detection timing pulses every six clocks (as many as six bytes). When the zero-detection is obtained, the timing generator generates the detection timing pulses every 53 clocks (corresponding to one cell). The detection timing pulses are also used to reset the flip-flops 31-1 to 31-8 of the CRC calculators 3-1 to 3-8 to 0. Outputs of the zero-detectors 4-1 to 4-8 are supplied to the SEL signal generator 6. The SEL signal generator 6 discriminates which one of the eight series satisfies the CRC rule and whether the cell delineation has been established or not on the basis of the input signal. The SEL signal generator 6 can be realized by a circuit shown in FIG. 12. An output of the generator 6 is supplied to the selector 7. The selector 7 selects the series in which the cell delineation was established and outputs such a series. The selector 7 can be realized by a circuit shown in FIG. 13. As described above, by converting the input signal into the parallel signals, a circuit construction suitable for the high speed signal is derived. On the other hand, by processing the CRC calculations by the parallel bit width which is smaller than that in the conventional technique, a hardware amount of the CRC calculators can be reduced and the number of registers necessary for parallel development can be reduced. Further, since the check of CRC is executed with respect to each of a plurality of parallel signals which were shifted one bit by one bit, the check of CRC is performed with respect to all of the phases, and the phase alignment control is unnecessary.

Figure 14:
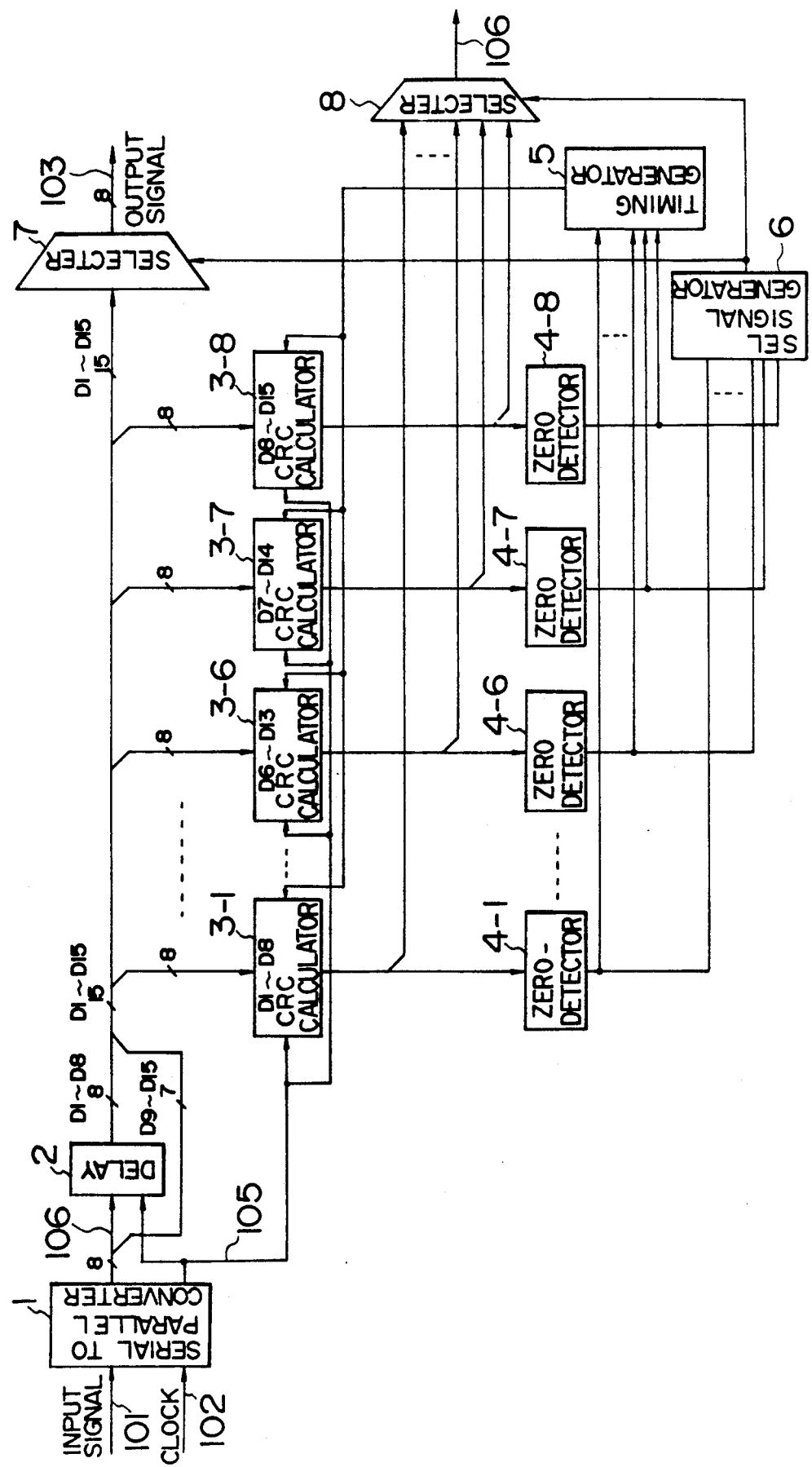
FIG. 14 is a constructional diagram of a cell delineation circuit in which a selector to output a syndrome is provided for the cell delineation circuit of FIG. 6.

The selector 8 selects and outputs the output signals of the plurality of parallel CRC calculators 3-1 to 3-8 by the SEL signal of the SEL signal generator 6. A selector is provided for the cell delineation circuit to select a normal syndrome to detect/correct a transmission error of the section which is subjected to the CRC calculation. FIG. 14 shows a constructional diagram of a cell delineation circuit in which the selector 8 is provided in the circuit of FIG. 6.

The SEL signal generator 6 has a priority control function to preferentially select in the case where the CRC rule was unexpectedly satisfied and the zero-detection pulses from the zero-detectors 4-1 to 4-8 were detected with respect to a plurality of series. To provide the priority control function, it is sufficient to use a priority encoder as an encoder 62 of an SEL signal generator shown in FIG. 12. By providing the priority control function, even in the case where the CRC rule was unexpectedly satisfied and the zero-detection pulses were detected with respect to a plurality of series, no competition occurs.

Figure 15:
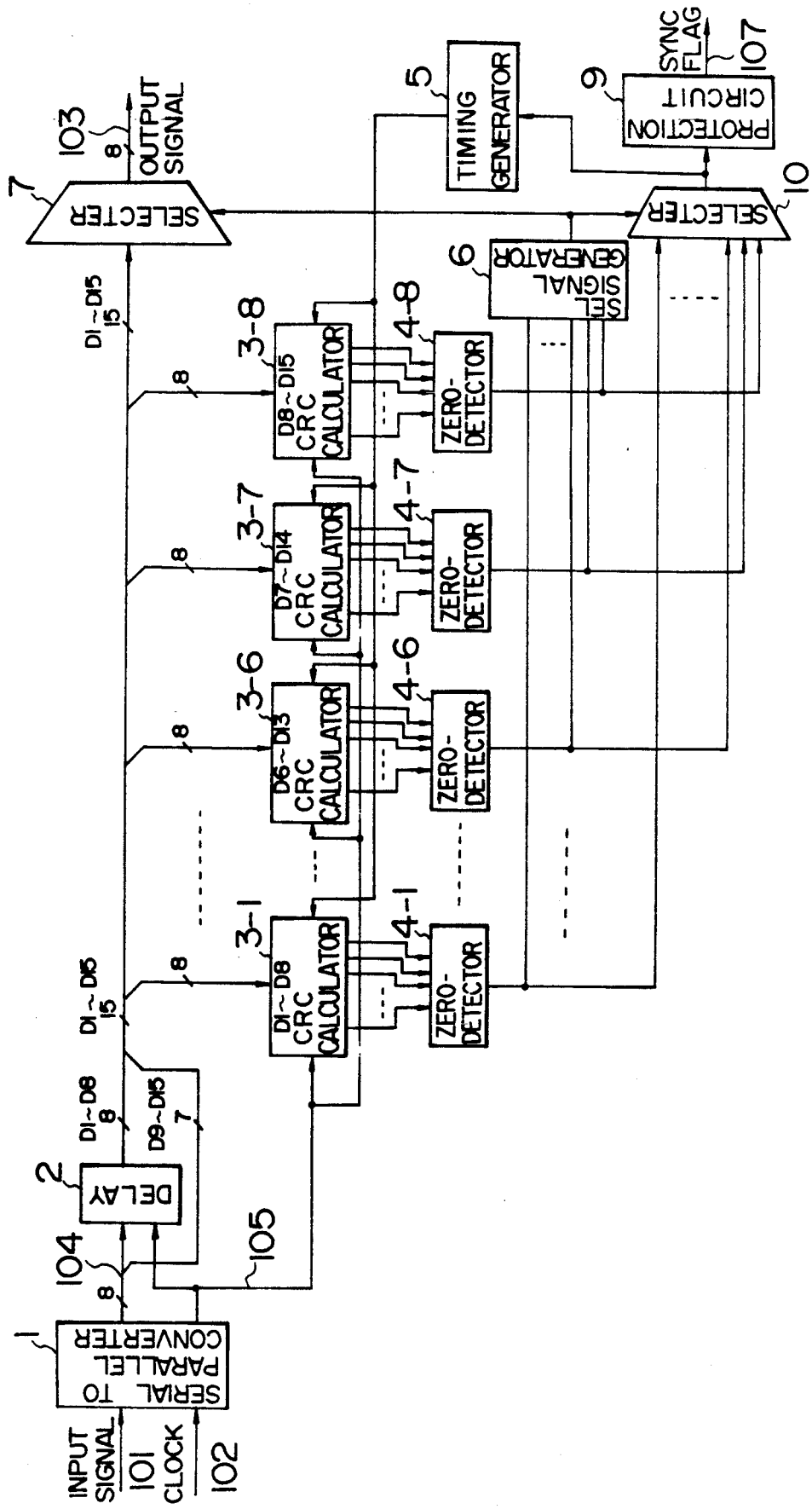
FIG. 15 is a constructional diagram of a cell delineation circuit in which one protection circuit is provided for the cell delineation circuit of FIG. 6.
Figure 16:
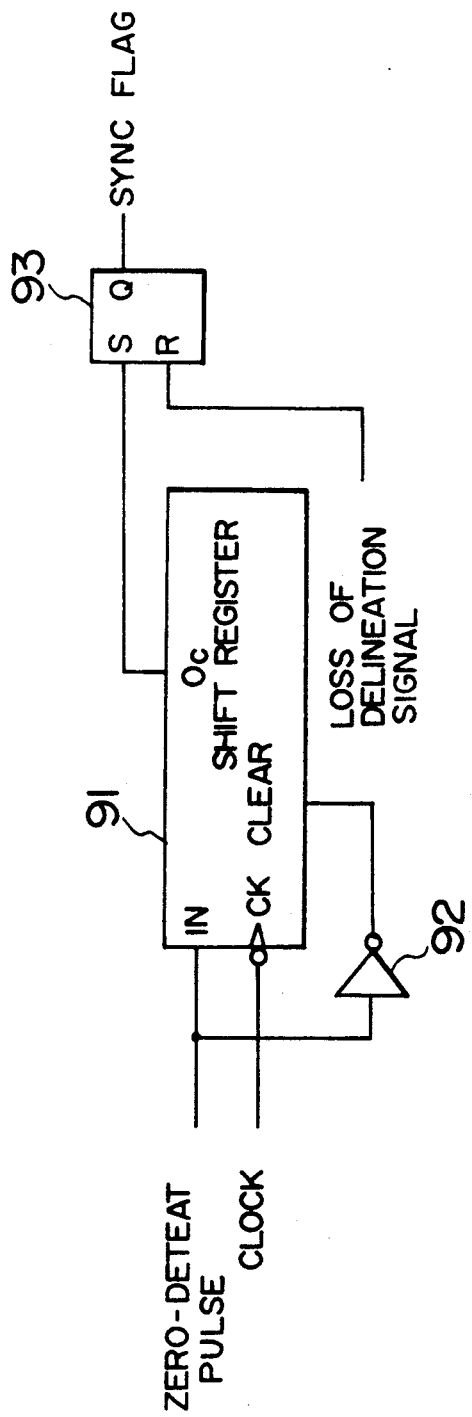
FIG. 16 is a circuit constructional diagram of a protection circuit.

The cell delineation circuit further has: a selector 10 to select and output the zero-detect pulses of the zero-detectors 4-1 to 4-8 by the SEL signal from the SEL signal generator 6; and a protection circuit 9 to output an SYNC flag from an output of the selector 10 and reduce an alignment error. FIG. 15 shows a constructional diagram of the cell delineation circuit. FIG. 16 shows the protection circuit. The protection circuit in FIG. 16 generates an SYNC flag when the zero-detection was derived three times consecutively. By providing the protection circuit, a probability of a delineation error can be reduced.

Figure 17:
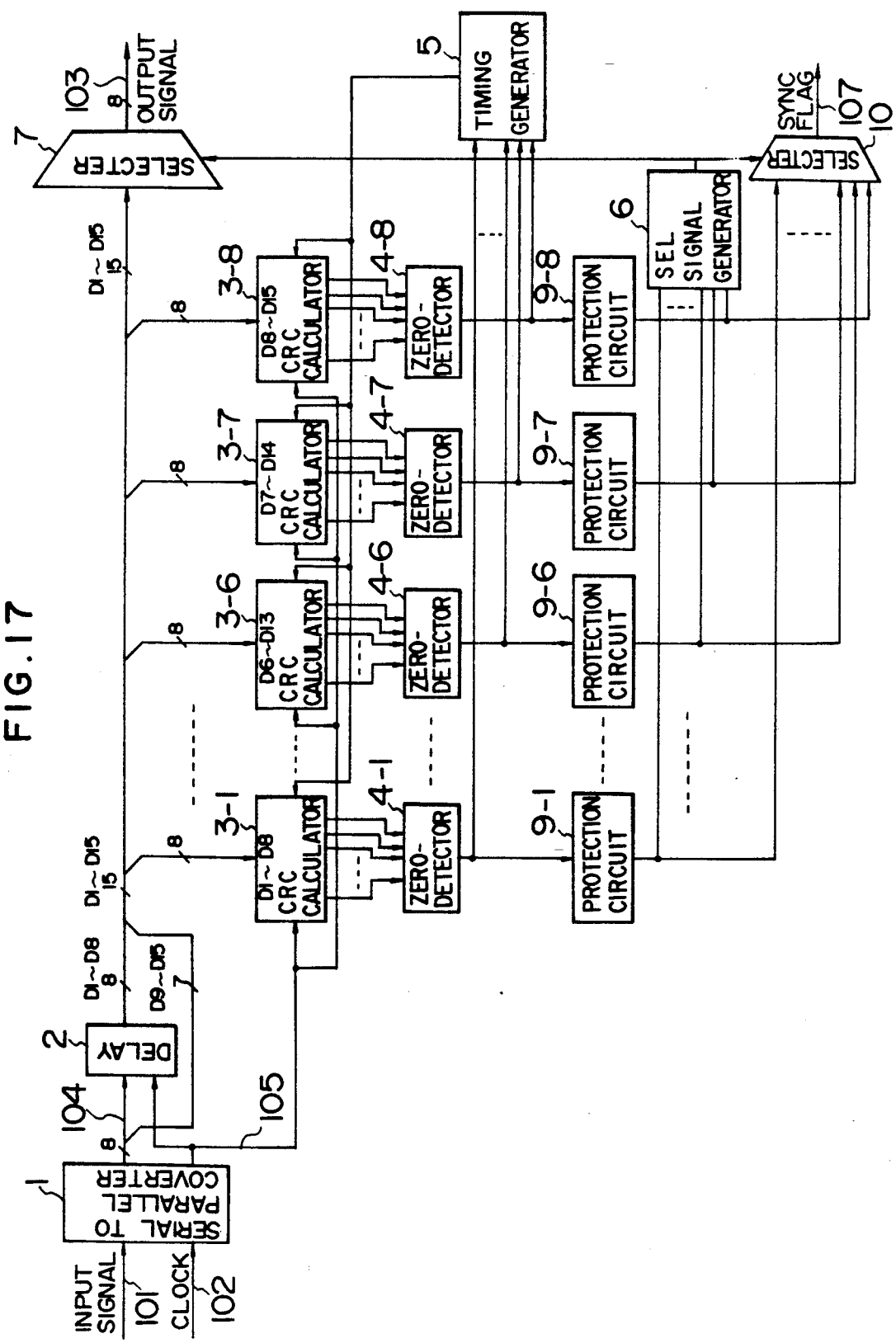
FIG. 17 is a constructional diagram of a cell delineation circuit in which a plurality of protection circuits are provided for the cell delineation circuit in FIG. 6.

Different from the cell delineation circuit of FIG. 16, a circuit of FIG. 17 has protection circuits 9-1 to 9-8 to reduce the probabilities of alignment errors for the zero-detection pulses of the zero-detectors 4-1 to -8, wherein zero-detect pulses of the protection circuits -1 to 9-8 are supplied to the SEL signal generator 6. By using such a construction, the probability of the alignment error can be further reduced as compared with the case of the cell delineation circuit using only one protection circuit 9 shown in FIG. 16. The circuit of FIG. 17 further has the selector 10 to select and output the SYNC flags from the protection circuits 9-1 to 9-8 by the SEL signal from the SEL signal generator 6.

Figure 18:
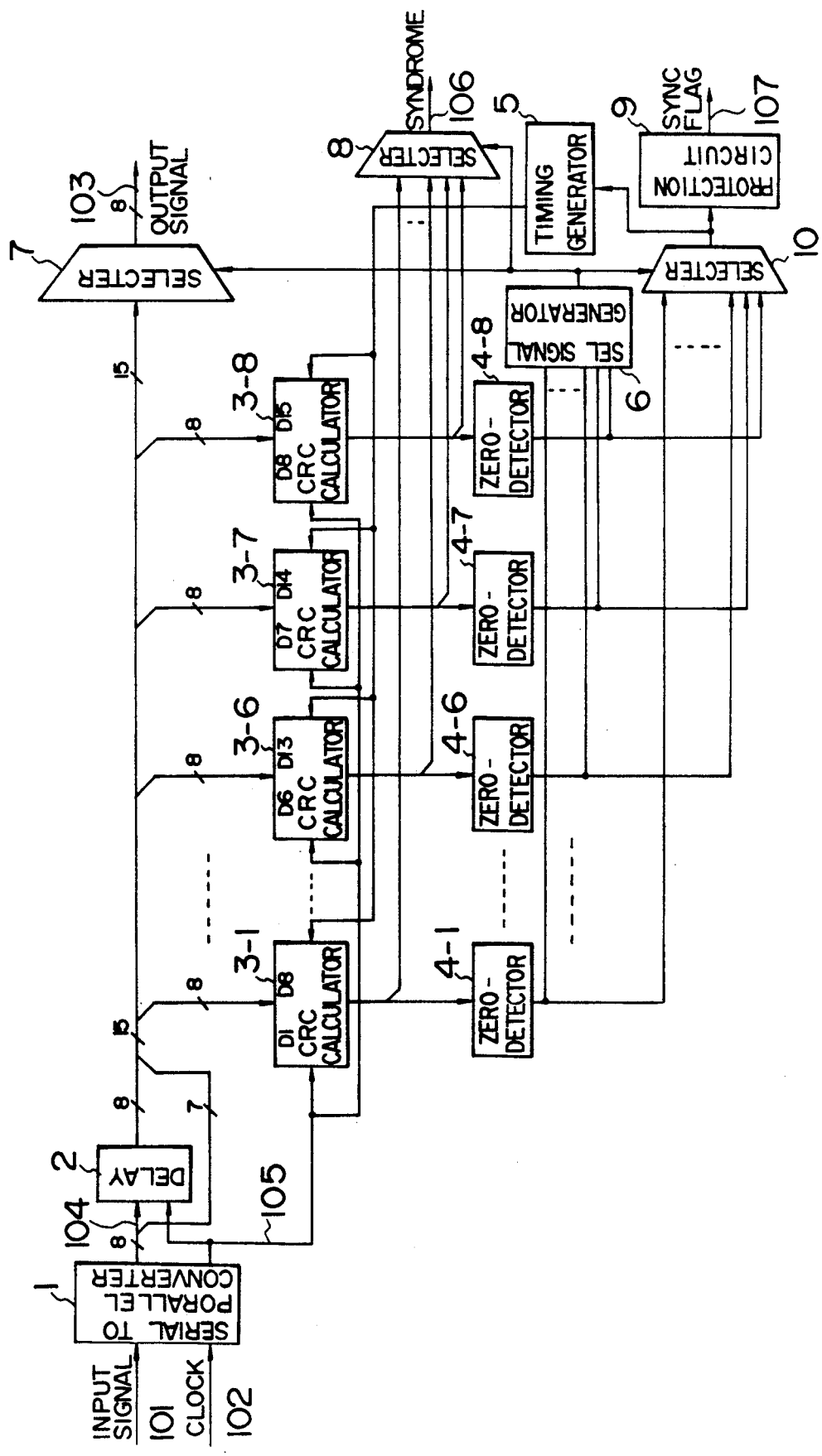
FIG. 18 is a constructional diagram of a cell delineation circuit in which a selector to output a syndrome is provided for the cell delineation circuit of FIG. 15.
Figure 19:
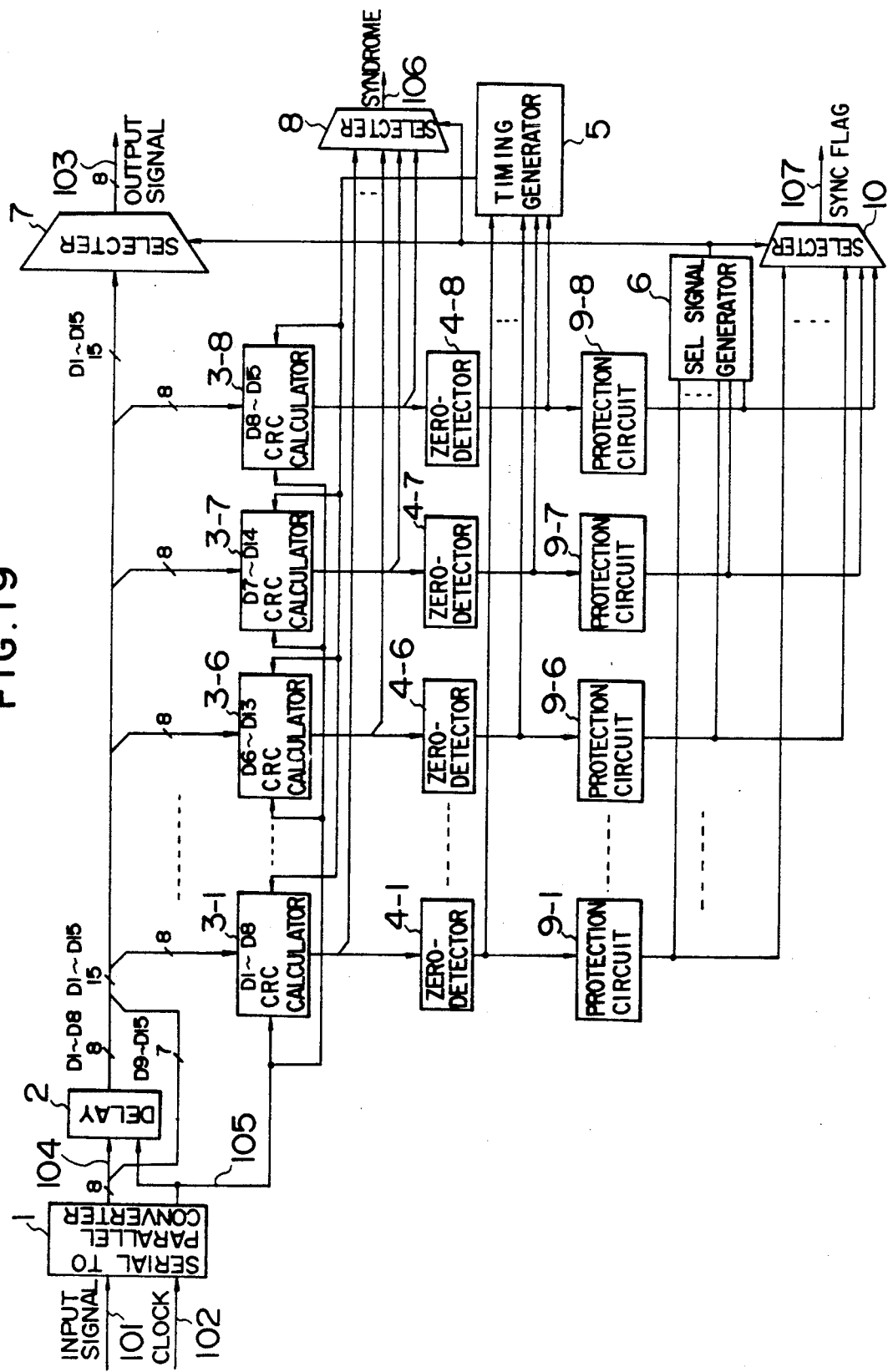
FIG. 19 is a constructional diagram of a cell delineation circuit in which a selector to output a syndrome is provided for the cell delineation circuit of FIG. 17.

FIG. 18 shows a cell delineation circuit having a construction in which the selector 8 to output a syndrome to detect/correct a transmission error of the section which is subjected to the CRC calculation is provided in the cell delineation circuit of FIG. 15. FIG. 19 shows a cell delineation circuit having a construction in which the selector 8 to output a syndrome to detect/correct a transmission error of the section which is subjected to the CRC calculation is provided for the cell delineation circuit of FIG. 17.

Figure 20:
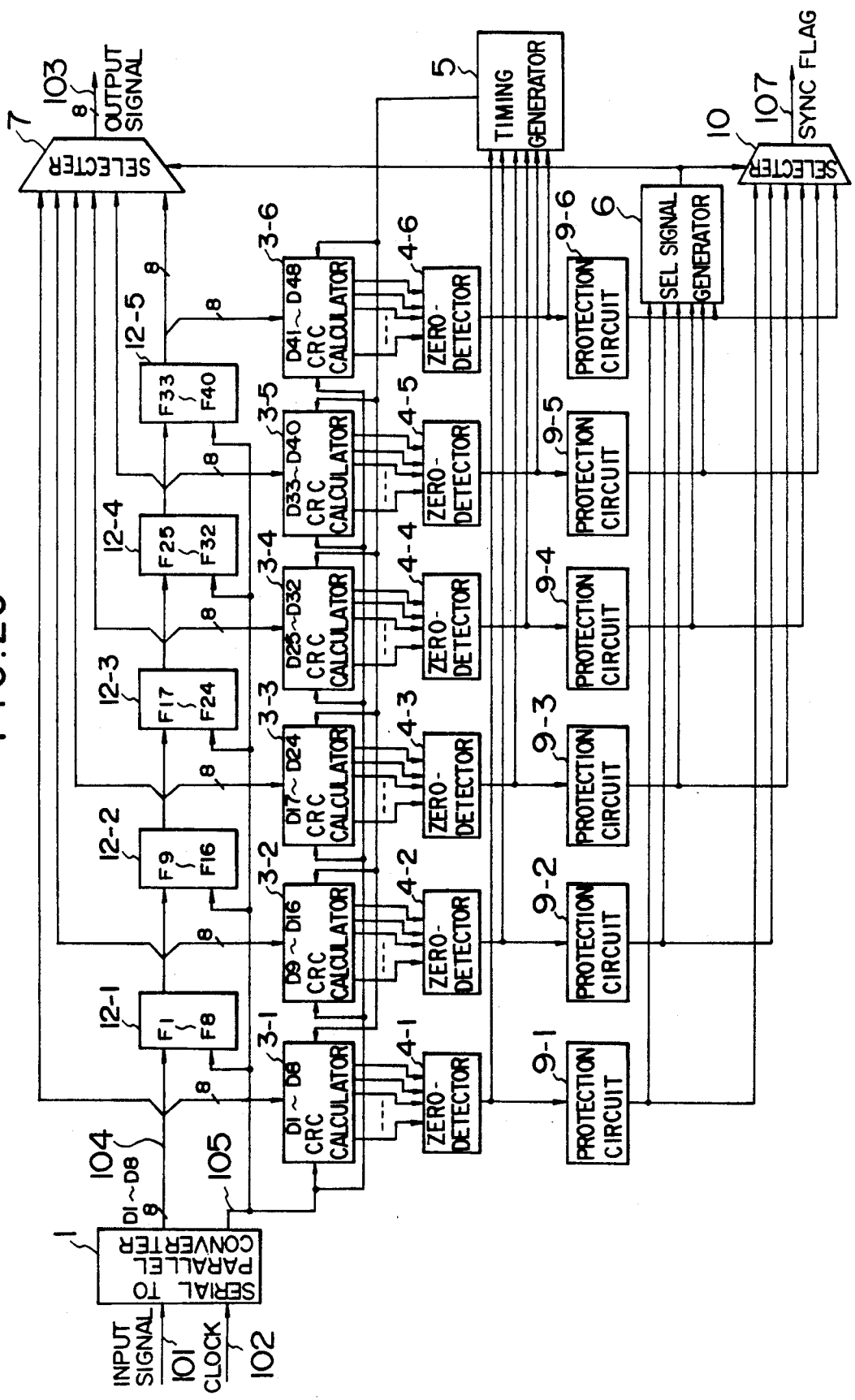
FIG. 20 is a constructional diagram of a cell delineation circuit in the case of processing a signal whose by alignment is obtained.

As another embodiment, FIG. 20 shows a construction of a cell delineation circuit in the case where the byte alignment was established. The circuit of FIG. 20 comprises: registers 12-1 to 12-5 to form 8-bits parallel signals of six series which were shifted one byte by one byte from the 8-bits parallel signals in which the byte alignment was established; the parallel CRC calculators 3-1 to 3-6 to CRC calculate the 8-bits parallel signals of the six series in an 8-bit parallel manner; the timing generator 5 to give the calculation timings to the parallel CRC calculators 3-1 to 3-6; the zero-detectors 4-1 to 4-6 to discriminate whether a pattern to be calculated satisfies the CRC rule or not from the results of the CRC calculations of the parallel CRC calculators 3-1 to 3-6; protection circuits 9-1 to 9-6 to reduce the probabilities of delineation errors for the zero-detection pulses of the zero-detectors 4-1 to 4-6; the SEL signal generator 6 to output a signal to select the series in which the cell delineation was established among the 8-bits parallel signals of the six series from the sync flags from the protection circuits 9-1 to 9-6; a selector 7' to select and output the series in which the cell delineation was established among the 8-bits parallel signals of the six series which were shifted one bit by one bit by the SEL signal of the SEL signal generator 6; and the selector 10 to select and output the SYNC flags from the protection circuits 9-1 to 9-6 by the SEL signal from the SEL signal generator 6 in order to output the SYNC flag. By using the above construction, the circuit scale can be further reduced.

As described above, by using the cell delineation circuit of the invention, it is possible to construct a cell delineation circuit which is suitable for a high speed signal and which can minimize an increase in hardware amount without needing the phase alignment control. On the other hand, in the cell delineation circuit in which the cell delineation is established by using a point that a certain information block in a cell satisfies the CRC rule, it is possible to realize the cell delineation circuit which is suitable for a high speed signal and which doesn't need the phase alignment control. An increase in hardware can be minimized.

We claim:

1. A cell delineation circuit comprising: p1 a serial to parallel converter to form a first set of parallel signals of n bits from an input signal:

a delay to form a plurality of second sets of parallel signals of n bits, wherein said plurality of second sets are arranged in a series so that each of said second sets has a predetermined position within the series, and so that the bit order of each of said second sets is shifted relative to the bit order of another one of said second sets which is adjacent to it in this series;

parallel CRC (Cyclic Redundancy Check) calculators for executing CRC calculations in an n-bit parallel manner for said second sets of parallel signals of n-bits;

a timing generator to provide calculation timings to said parallel CRC calculators;

zero-detectors to discriminate whether a bit pattern to be calculated satisfies a predetermined CRC rule or not on the basis of results of the CRC calculations of the parallel CRC calculators; p1 an SEL signal generator to output a selection signal to select one of said second sets of parallel signals of n-bits in which a zero-detection was derived and to establish a cell delineation among the series of second sets of parallel signals of n-bits from outputs of said zero-detectors; and a selector to select and output said one of said second sets in which a cell delineation was established among the series of second sets of parallel signals of n-bits based on the SEL signal of the SEL signal generator.

2. A circuit according to claim 1, wherein said first and second sets of signals of n-bits are set to 8-bit parallel signals and the cell delineation is established.

3. A circuit according to claim 2, wherein the second sets of 8-bit parallel signals are set to 8-bit parallel signals of eight second sets and cell delineation is established.

4. A circuit according to claim 2, further having a selector to select and output signals of said plurality of parallel CRC calculators by the SEL signal of the SEL signal generator in order to detect/correct a transmission error of a section which is subjected to the CRC calculations.

5. A circuit according to claim 2, wherein the SEL signal generator has the function of a priority encoder to preferentially select a predetermined one of the six sets of 8-bit parallel signals in the case where a CRC rule was erroneously satisfied and zero-detect pulses from the zero-detectors were detected with respect to a plurality of six set of 8-bit parallel signals.

6. A circuit according to claim 2, comprising:
a selector to select and output zero-detect pules of the zero-detectors based on the SEL signal from the SEL signal generator; and
a protection circuit to output an SYNC flag from an output of said selector and reduce the probability of an alignment error.

7. A circuit according to claim 2, further having protection circuits to reduce the probability of an alignment error for zero-detect pulses of the zero-detectors, an wherein SYNC flags of said protection circuits are supplied to the SEL signal generator.

8. A circuit according to claim 1, further having a protection to reduce the probability of an alignment error for each of zero-detect pulses of said zero-detectors, and wherein a SYNC flag of said protection circuit is supplied to the SEL signal generator.

9. A circuit according to claim 8, further having a sector to select and output the SYNC flag from the protection circuit by the SEL signal from the SEL signal generator in order to output the SYNC flag.

10. A circuit according to claim 1, further having a selector to select and output signals of said plurality of parallel CRC calculators from the SEL signal of the SEL signal generator in order to detect/correct a transmission error of a section which is subjected to the CRC calculations.

11. A circuit according to claim 10, wherein the SEL signal generator has the function of a priority encoder to preferentially select a predetermined one of the six sets of 8-bit parallel signals in the case where a CRC rule was erroneously satisfied and zero-detect pulses from the zero-detectors were detected with respect to a plurality of six sets of 8-bit parallel signals.

12. A circuit according to claim 1, wherein the SEL signal generator has the function of a priority encoder to preferentially select a predetermined second set in the case where a CRC rule was erroneously satisfied and zero-detect pulses from said zero-detectors were detected with respect to a plurality of said second sets of said series.

13. A circuit according to claim 12, comprising:
a selector to select and output the zero-detect pulses of the zero-detectors based on the SEL signal from the SEL signal generator; and
a protection circuit to output a SYNC flag from an output of said selector and reduce the probability of ann alignment error.

14. A circuit according to claim 12, further having protection circuits to reduce the probability of an alignment error for each of the zero-detect pulses of the zero-detectors, and wherein SYNC flags of said protection circuits are supplied to the SEL signal generator.

15. A circuit according to claim 1, comprising:
a selector to select and output zero-detect pulses of said zero-detectors based on the SEL signal from the SEL signal generator; and
a protection circuit to output a SYNC flag from an output of said selector and to reduce the probability of an alignment error.

16. A cell delineation circuit comprising:
a register to form six sets of 8-bit parallel signals which were shifted one byte by one byte from 8-bit parallel signals in which a byte alignment was established;
parallel CRC (Cyclic Redundancy Check) calculators to perform CRC calculations on the six sets of the 8-bit parallel signals in an 8-bit parallel manner;
a timing generator to provide calculation timings to said parallel CRC calculators;
zero-detectors to discriminate whether a pattern to be calculated satisfies a CRC rule or not on the basis of results of the CRC calculations of the parallel CRC calculators;
protection circuits to reduce the probability of an alignment error for each of zero-detect pulses of the zero-detectors;
an SEL signal generator to output a selection (SEL) signal to select one of the six sets of 8-bit parallel signals in which a cell delineation was established from a SYNC flag from the protection circuit;
a selector to select and output the one of the six sets of 8-bit parallel signals in which a cell delineation was established based on the SEL signal of the SEL signal generator; and
a selector to select and output the SYNC flag from the protection circuit based on the SEL signal from the SEL signal generator in order to output the SYNC flag.

17. A cell delineation method comprising the steps of:
converting an input signal into a first set of n-bit parallel signals;
forming a plurality of second sets of n-bit parallel signals from said first set of n-bit parallel signals;
wherein said plurality of second sets are arranged in a series so that each of said second sets has a predetermined position within the series, and so that the bit order of each of said second sets is shifted relative to the bit order of another one of said second sets which is adjacent to it in this series;

executing CRC (Cyclic Redundancy Check) calculations for each of said plurality of second sets of n-bit parallel signals in parallel;

determining whether one of said second sets of n-bit parallel signals has a bit pattern which satisfies a predetermined CRC rule according to results of the CRC calculations;

selecting the one of said second sets of n-bit parallel signals which is determined as satisfying the predetermined CRC rule; and outputting said selected one of said second sets of n-bit parallel signals.

18. A cell delineation circuit comprising:

means for converting an input signal into a first set of n-bit parallel signals;

means for forming a plurality of second sets of n-bit parallel signals from said first set of n-bit parallel signals, wherein said plurality of second sets are arranged in a series so that each of said second sets has a predetermine position within the series, and so that the bit order to each of said second sets is shifted relative to the bit order of another one of said second sets which is adjacent to it in this series;

means for executing CRC (Cyclic Redundancy Check) calculations for each of said plurality of second sets of parallel signals in parallel;

means for determining whether one of said second sets of n-bit parallel signals satisfies a predetermined CRC rule according to results of the CRC calculations;

means for selecting the one of said second sets of n-bit parallel signals with which is determined as satisfying the predetermined CRC rule; and means for outputting said selected one of said second sets of n-bit parallel signals.

* * * * *